United States Patent
Carret et al.

(10) Patent No.: US 11,009,573 B2
(45) Date of Patent: May 18, 2021

(54) CELL FOR NUCLEAR MAGNETIC RESONANCE MEASUREMENT IN A LIQUID MEDIUM, SYSTEM COMPRISING SUCH A CELL AND THE USE THEREOF

(71) Applicant: COMMISSARIAT A L'ENERGIE ATOMIQUE ET AUX ENERGIES ALTERNATIVES, Paris (FR)

(72) Inventors: Guillaume Carret, Orsay (FR); Thomas Berthelot, Les Ulis (FR); Patrick Berthault, Magny les Hameaux (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 16/491,136

(22) PCT Filed: Mar. 8, 2018

(86) PCT No.: PCT/EP2018/055794
§ 371 (c)(1),
(2) Date: Sep. 4, 2019

(87) PCT Pub. No.: WO2018/162652
PCT Pub. Date: Sep. 13, 2018

(65) Prior Publication Data
US 2020/0033427 A1    Jan. 30, 2020

(30) Foreign Application Priority Data

Mar. 8, 2017   (FR) ...................................... 1751895

(51) Int. Cl.
*G01R 33/34* (2006.01)
*G01R 33/30* (2006.01)
(Continued)

(52) U.S. Cl.
CPC ...... *G01R 33/34092* (2013.01); *G01R 33/307* (2013.01); *G01R 33/3628* (2013.01); *G01R 33/46* (2013.01); *G01R 33/302* (2013.01)

(58) Field of Classification Search
CPC ............ G01R 33/34092; G01R 33/307; G01R 33/3628; G01R 33/46
See application file for complete search history.

(56) References Cited

U.S. PATENT DOCUMENTS

| | | | |
|---|---|---|---|
| 8,106,657 B2* | 1/2012 | Sakellariou | .......... G01R 33/307 324/321 |
| 2011/0025326 A1 | 2/2011 | Zens | |
| 2016/0178544 A1* | 6/2016 | Causier | .................. G01R 33/46 324/309 |

FOREIGN PATENT DOCUMENTS

FR    3 030 770 A1    6/2016

OTHER PUBLICATIONS

Carret, et al., "Enhancing NMR of Nonrelaxing Species Using a Controlled Flow Motion and a Miniaturized Circuit", Analytical Chemistry, vol. 89, No. 5, pp. 2995-3000, Mar. 7, 2017.
(Continued)

*Primary Examiner* — G. M. A Hyder
(74) *Attorney, Agent, or Firm* — BakerHostetler (57) ABSTRACT

A liquid-state nuclear-magnetic-resonance measurement cell includes a reservoir for a liquid medium; a fluidic circuit connected to the reservoir and comprising a measurement chamber; a gas injector opening into the fluidic circuit, at a distance from the measurement chamber; and a coil encircling the measurement chamber; wherein it also comprises at least one capacitive element forming, with the coil, an electromagnetic resonator; and in that it has a shape allowing its introduction into a nuclear-magnetic-resonance probe in replacement of an assembly formed by a nuclear-magnetic-resonance tube and a spinner bearing the tube, the coil (Continued)

encircling the measurement chamber being then positioned so as to couple by induction to at least one radiofrequency coil of the probe. Nuclear-magnetic-resonance measurement system comprising such a measurement cell. Magnetic-resonance measurement method using such a cell is also provided.

15 Claims, 5 Drawing Sheets (51) Int. Cl.
G01R 33/36 (2006.01)
G01R 33/46 (2006.01)

(56) References Cited

OTHER PUBLICATIONS

Tang, et al., "Practical aspects of liquid-state NMR with inductively coupled solenoid coils", Magnetic Resonance in Chemistry, vol. 48, No. 10, pp. 763-770, Oct. 1, 2010.
Webb, et al., "Radiofrequency microcoils for magnetic resonance imaging and spectroscopy", Journal of Magnetic Resonance, vol. 229, pp. 55-66, Oct. 26, 2012.
Foley, et al., "NMR Flow Tube for Online NMR Reaction Monitoring", Analytical Chemistry, vol. 86, No. 24, pp. 12008-12013, Dec. 16, 2014.
Marsden, et al., "Improving the Mass-Limited Performance of Routine NMR Probes using Coupled Coils", Journal of Magnetic Resonance, vol. 268, pp. 25-35, Apr. 20, 2016.

* cited by examiner

CELL FOR NUCLEAR MAGNETIC RESONANCE MEASUREMENT IN A LIQUID MEDIUM, SYSTEM COMPRISING SUCH A CELL AND THE USE THEREOF

CROSS-REFERENCE TO RELATED APPLICATIONS

This application is a National Stage of International patent application PCT/EP2018/055794, filed on Mar. 8, 2018, which claims priority to foreign French patent application No. FR 1751895, filed on Mar. 8, 2017, the disclosures of which are incorporated by reference in their entirety.

FIELD OF THE INVENTION

The invention relates to a nuclear-magnetic-resonance (NMR) measurement cell, to a system comprising such a cell and to an NMR measurement method using such a cell and such a system. It relates to the fields of liquid-state NMR spectroscopy and micro-imaging. Its applications comprise, inter alia, magnetization-transfer NMR techniques, the study of the progress of biochemical or chemical reactions and biology (study of living cells).

BACKGROUND

NMR is a technique in which very small amounts of energy are involved and therefore a number of acquisitions are accumulated in order to increase signal-to-noise ratio. Conventionally, between two successive measurements carried out on a given sample, it is necessary to wait for the longitudinal relaxation of the excited nuclear spins. However, for certain nuclear species, the longitudinal relaxation time (traditionally designated by "T1") may be very long—a few tens of seconds to several minutes. The accumulation of a large number of measurements may therefore take a very long time. In certain cases, it is possible to circumvent this difficulty by transferring magnetization to a nucleus having a shorter relaxation time. This approach however cannot be generalized.

In the case of a fluid sample, one possible solution to the problem of longitudinal relaxation time consists in causing the sample to flow through a measurement chamber containing, at any given time, a small portion of the total volume of the fluid. Thus, different nuclei are the subjects of the various measurements to be accumulated; relaxation time therefore no longer limits the acquisition rate. This however raises the problem of how to produce such a flow of fluid in the interior of an NMR apparatus.

Document FR 3 030 770 and the article by G. Carret, T. Berthelot and P. Berthault "Enhancing NMR of Nonrelaxing Species Using a Controlled Flow Motion and a Miniaturized Circuit", Analytical Chemistry 2017, 89 (5), pp 2995-3000, disclose a measurement cell allowing this problem to be solved. This measurement cell comprises a reservoir for a liquid sample, a measurement chamber encircled by a radiofrequency (RF) micro-coil and channels forming a fluidic circuit connecting the reservoir to the measurement chamber. An additional channel allows a gas to be injected into the fluidic circuit, at a certain distance from the measurement chamber. More precisely, the measurement chamber is arranged in a bottom portion of the cell, the reservoir in a top portion and the injection of the gas occurs in a substantially vertical section of the circuit. The injected gas forms bubbles that rise toward the reservoir, from where the gas escapes; this causes the liquid to flow in the direction of movement of the bubbles (principle called the "bubble micropump" principle). It is important that the bubbles do not penetrate into the measurement chamber, because this would decrease the uniformity of the electromagnetic fields. The radiofrequency micro-coil is electrically connected in the place of a "conventional" coil of an NMR probe in order to excite nuclear spins in the interior of the measurement chamber and to detect their response, which forms the NMR signal.

In addition to allowing the liquid to be made to move, the gas injection may also serve other purposes:

It may be a hyperpolarized gas (for example xenon or helium 3) in order to achieve a transfer of magnetization and thus increase the signal level.

It may convey oxygen, for example in order to keep cells in suspension in the liquid alive, or other additives.

It may form the fluid to be studied, in which case the presence of liquid is not essential.

Moreover, the duct for injecting the gas may also be used to introduce liquids or powders. One particularly advantageous application consists in using this duct to introduce a reagent that reacts with the liquid already present in the cell; the introduction of gas causes the mixture to move and homogenizes it (if several fluid-introduction ducts are available, it is preferable to start by injecting gas, and therefore by making the liquid move, before introducing the reagent). In this way, it is possible to track by NMR the progress of a biochemical or chemical reaction (an enzymatic reaction for example). It is important to note that the reaction starts in the interior of the NMR spectrometer, this allowing its beginning to be studied. In contrast, in a conventional system, the reagents are mixed in the NMR tube before its introduction into the spectrometer; it is therefore not possible to follow the beginning of the reaction.

The prior-art measurement cell has a simple structure and may be manufactured additively ("3D printing"). However, it has two major drawbacks:

Firstly, in order to be able to be supplied with a radiofrequency signal, the micro-coil must have a specific connector, compatible with that of a commercially available NMR probe into which the cell is integrated, and the RF coil of which it replaces. It follows that one measurement cell is specifically suitable for one particular type of NMR probe.

Secondly, mounting of the cell is long and complex. It is firstly necessary to extract the NMR probe from the magnet of the measurement apparatus, to demount its RF coil, to replace it with the measurement cell, then to reintroduce the assembly into the apparatus. Furthermore, these operations must be repeated on each change of sample.

The publication by A. Tang and A. Jerschow: A. Tang and A. Jerschow, "Practical aspects of liquid-state NMR with inductively coupled solenoid coils", Magnetic Resonance in Chemistry, 48: 763-770, 2010, presents an NMR micro-coil encircling a capillary tube that contains a liquid sample, the capillary tube/micro-coil assembly being located in an NMR tube filled with an oil allowing the effects of magnetic susceptibility to be decreased. The tube is inserted into a commercially available NMR probe and the micro-coil is powered by inductive coupling using the paired saddle coil of the probe. This assembly has the drawback of being single-use.

SUMMARY OF THE INVENTION

The invention aims to overcome these drawbacks. More particularly, it aims to provide a liquid-state (or more generally, fluid-state) nuclear-magnetic-resonance measurement cell that is more simple to use and less dependent on the choice of a particular type of NMR probe than the cell known in the prior art, while preserving its advantageous features.

According to the invention, this aim is achieved by virtue of a cell that:

on the one hand, has a micro-coil inductively coupled to the RF coil of the probe, instead of being electrically connected in the place of the latter;

on the other hand, has a shape allowing it to be introduced into the nuclear magnetic resonance probe by replacement of—i.e. in the location normally occupied by—an assembly formed by a nuclear-magnetic-resonance tube and a "spinner" bearing said tube (the spinner is simply a holder for the NMR tube; it owes its name to the fact that in certain NMR apparatuses, mainly older ones, it was made to rotate). Commercially available NMR tubes and spinners have a limited number of shapes and dimensions. More precisely, the micro-coil and the measurement chamber are then placed in the portion of the cell corresponding to the NMR tube, whereas the reservoir of liquid and the gas injector occupy the portion of the cell corresponding to the spinner.

The inductive coupling between the micro-coil of the measurement cell and the RF coil of the probe make it possible not to have to demount the latter. Furthermore, the measurement cell need no longer comprise a specific connector, this making it largely independent of the measurement probe used. The shape of the measurement cell allows it to be introduced exactly as one would introduce a standard NMR tube, with its spinner. Of course, this is possible only by virtue of the absence of electrical connection between the micro-coil and the probe. With respect to the aforementioned device of A. Tang and A. Jerschow, the cell of the invention has the advantage of being re-usable, by virtue of the presence of the fluidic circuit. It should be noted that it would not be possible, for reasons of bulk, to introduce a fluidic circuit into a single NMR tube, this explaining why A. Tang and A. Jerschow use as measurement chamber a single capillary tube sealed at one end.

One subject of the invention is therefore a liquid-state nuclear-magnetic-resonance measurement cell comprising:

a reservoir for a liquid medium;
a fluidic circuit connected to said reservoir and comprising a measurement chamber;
a gas injector opening into said fluidic circuit, at a distance from said measurement chamber; and
a coil encircling said measurement chamber;
characterized in that:
it also comprises at least one capacitive element forming, with said coil, an electromagnetic resonator;
and in that:
it has a shape allowing its introduction into a nuclear-magnetic-resonance probe in replacement of an assembly formed by a nuclear-magnetic-resonance tube and a spinner bearing said tube, the coil encircling the measurement chamber then being positioned so as to couple by induction to at least one radiofrequency coil of said probe.

According to particular embodiments of such a measurement cell:

The fluidic circuit may have a shape such that the introduction of gas by said injector causes the liquid medium to flow through the fluidic circuit.

Said fluidic circuit may also comprise an orifice for exit of gas, said orifice being spaced apart from said gas injector.

The cell may also comprise at least one fluid injector, other than said gas injector, opening into said fluidic duct.

The cell may also comprise a mechanical system allowing the measurement cell to be made to turn, in the interior of said nuclear-magnetic-resonance probe, about an axis perpendicular to a longitudinal axis of said coil.

The cell may be manufactured, with the exception at the very most of said measurement chamber and of said electromagnetic resonator, by three-dimensional printing. More particularly, said reservoir may have internal walls having a protective coating, for example made of parylene.

Another subject of the invention is a nuclear-magnetic-resonance measurement system comprising:

a nuclear-magnetic-resonance spectrometer;
a nuclear-magnetic-resonance probe mounted in the interior of said nuclear-magnetic-resonance spectrometer; and
a measurement cell such as described above, arranged in the interior of said nuclear-magnetic-resonance probe in replacement of an assembly formed by a nuclear-magnetic-resonance tube and a spinner bearing said tube.

In such a measurement system, the coil of said measurement cell may be oriented so as to maximize the coupling by induction with a radiofrequency coil of said probe.

Yet another subject of the invention is a magnetic-resonance measurement method comprising the steps of:

a) filling the reservoir and fluidic circuit of a measurement cell such as described above with a liquid medium, subject of the measurement;

b) introducing said measurement cell into a nuclear-magnetic-resonance probe mounted in a nuclear-magnetic-resonance spectrometer in replacement of an assembly formed by a nuclear-magnetic-resonance tube and a spinner bearing said tube;

c) introducing a gas into the gas injector of said measurement cell, causing the liquid medium to flow through the fluidic circuit of the cell;

d) applying to a radiofrequency coil of said probe, coupled by induction to the coil of said measurement cell, a radiofrequency signal at a resonant frequency of the electromagnetic resonator of said measurement cell; and e) using said or another radiofrequency coil of said probe, also coupled by induction to the coil of said measurement cell, to acquire a nuclear-magnetic-resonance signal.

Such a method may advantageously comprise an additional step of:

f) turning the measurement cell about an axis perpendicular to a longitudinal axis of its coil until an intensity of said nuclear-magnetic-resonance signal is maximized.

The gas introduced into the gas injector of said measurement cell may be a hyperpolarized gas.

The method may also comprise, after said step c), a step consisting in:

c1) introducing into the measurement cell, by means of said gas injector or said or at least one said fluid injector, at least one fluid suitable for generating a biochemical or chemical reaction with the liquid contained in the reservoir and the fluidic circuit of said measurement cell, the nuclear-magnetic-resonance signal acquired in said step e) allowing the progress of said biochemical or chemical reaction to be followed.

BRIEF DESCRIPTION OF THE DRAWINGS

Other features, details and advantages of the invention will become apparent on reading the description given with reference to the appended drawings, which are given by way of example and show, respectively.

DETAILED DESCRIPTION

Figure 3A:
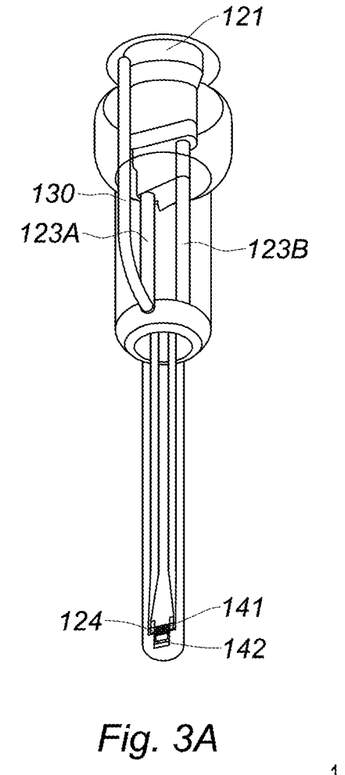
FIG. 3A, a perspective view of the cell of FIGS. 2A and 2B, and FIG. 3B a detail of FIG. 3A.

A measurement cell 1 according to the invention comprises an insert 10, intended to be introduced into an NMR probe in the place of a spinner/tube assembly, and a rod 11 made of a magnetic material that ends in a stop 12. The rod 11 allows the insert to be introduced into a cylindrical space encircled by the magnet of the NMR measurement system, at the end of which the NMR probe is found (see FIG. 5, in which the magnet is referenced by the reference 50, the cylindrical space by 51 and the NMR probe by 2). The insertion is typically achieved from above, until the stop 12 abuts against the upper surface of the system. The length of the rod 11 is chosen such that, at this point, the insert 10 is positioned in the middle of the RF coil 20 of the probe 2. Preferably, the insert is able to turn inside the space 51, about an axis embodied by the rod; advantageously, the stop 12 is graduated, such that the orientation of the insert can be known and therefore adjusted precisely. The importance of these features will be understood below with reference to FIGS. 3A and 3B.

Figure 1:
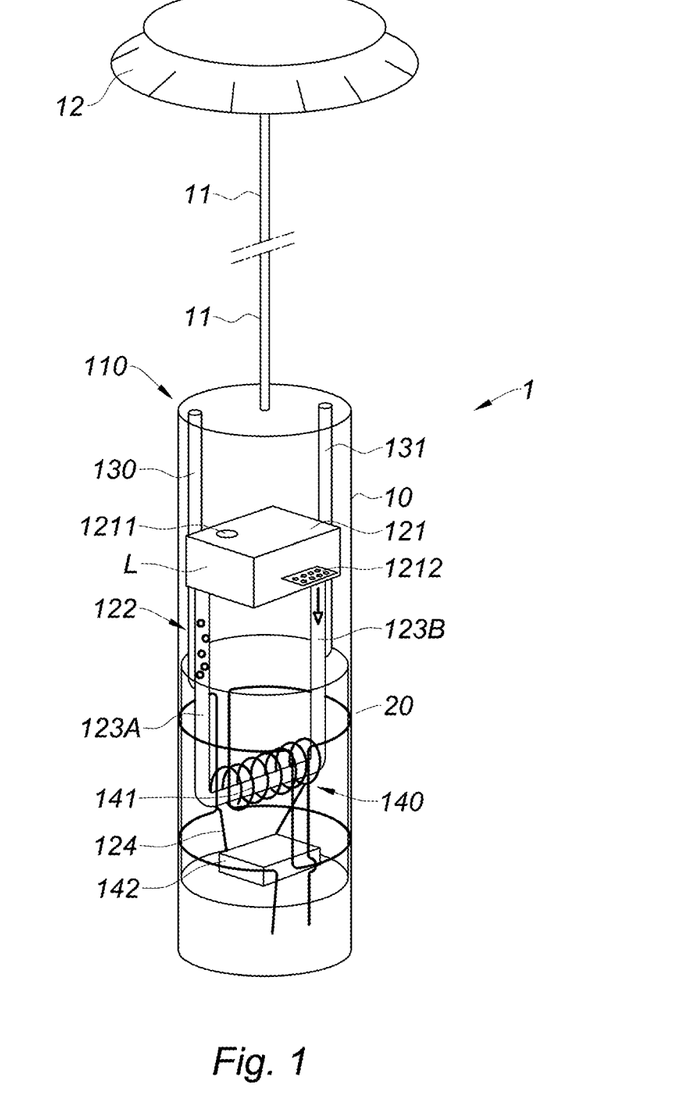
FIG. 1, a schematic diagram of a measurement cell according to the invention.

According to one advantageous embodiment of the invention, the insert 10 essentially consists of a block 110 of polymer, or "body" of the cell, which is additively manufactured (3D printing). An empty volume 120 in the interior of this block defines a reservoir 121, located in the upper portion of the insert, and a fluidic circuit 122 having two ends that open into the reservoir. In the embodiment of FIG. 1, the fluidic circuit 122 is generally U-shaped and comprises two arms of vertical orientation, 123A and 123B, and a horizontal segment 124, forming the measurement chamber. A duct 130, also of vertical orientation, has an end that opens into the arm 123A and another end in communication with the exterior of the insert, so as to allow gas to be inserted into the fluidic circuit 122. The injected gas forms bubbles 100 that rise towards the reservoir, causing the liquid L filling the fluidic circuit to flow in the direction of movement of the bubbles. At the top of the reservoir, an aperture 1211 allows the gas to escape. A grid 1212, at the entrance of the arm 123B of the circuit, prevents foam, which may potentially be formed by the injection of gas, from being able to be entrained into the measurement chamber.

The cell of FIG. 1 also comprises an additional duct 131 for injecting fluids, which opens into the arm 123B. This duct may for example serve to introduce a reagent into the cell. The presence of one or more of these additional ducts is optional. When they are present, their number is typically comprised between 1 and 4.

A solenoid coil 141 encircles the measurement chamber 124 and forms, with a capacitive element (capacitor) 142, an electromagnetic resonator, and more precisely an LC resonant circuit 140 that is tuned to the operating frequency of the NMR probe 2. It will be noted that the coil 141 is located in the middle of the RF coil 20 of the probe 2, which may be of the "paired saddle" type. The two coils are inductively coupled; in other words, they form the primary and secondary of a transformer. Thus, when the coil 20 is supplied with a radiofrequency signal at a frequency f inside the resonant band of the LC circuit 140, the latter is excited in turn. The coil 141 of the cell transfers this signal to the nuclear spins contained in the measurement chamber, and collects their response signal. This response signal is transmitted, also by inductive coupling, to the coil 20, whereby it reaches the acquisition chain of the NMR system. The measurement chamber is very small with respect to the interior volume of the coil 20, therefore the latter could not effectively excite the nuclear spins, nor effectively collect the NMR signal, because of the low fill factor. In contrast, the coil 141 has a high fill factor, and therefore may effectively excite the nuclear spins in the interior of the measurement chamber, and just as effectively collect the signal of interest.

Figure 2A:
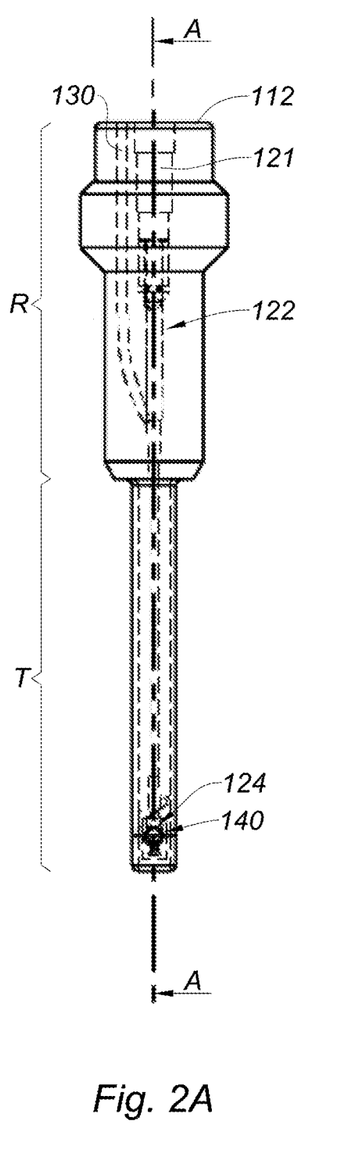
FIGS. 2A and 2B, a cross-sectional view of a measurement cell according to one embodiment of the invention.
Figure 2B:
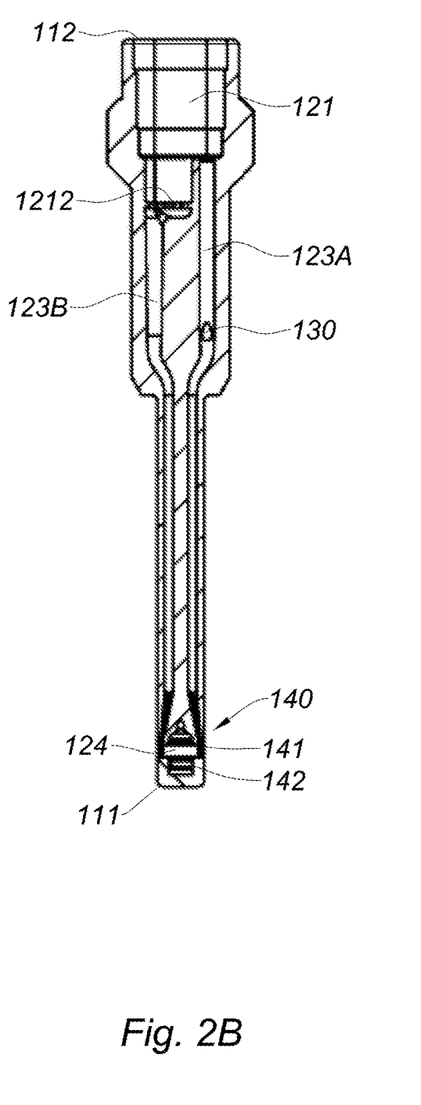

FIG. 1 is very schematic, and does not reproduce the veritable shape of a measurement cell according to the invention. This shape, in contrast, is shown in FIGS. 2A and 2B (cross-sectional views; FIG. 2B in particular corresponds to a cross section along the direction A-A identified in FIG. 2A), and in FIG. 3A (perspective view). In these figures, it is possible to see an upper portion R the shape and dimensions of which correspond to those of a "spinner", and a lower portion T, which is narrower and more elongate, the shape and dimensions of which correspond to those of an NMR tube. The upper portion R comprises the fluidic circuit and the lower portion T comprises the measurement chamber and the micro-coil.

Figure 3B:
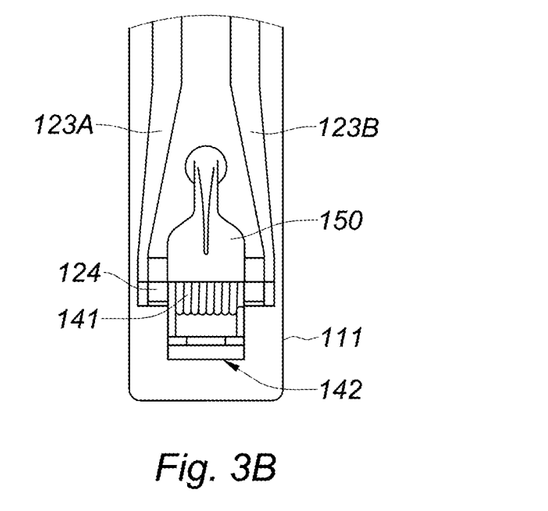

FIG. 3B shows a detail view of the lower end of the body of the measurement cell, containing the measurement chamber 124 and the resonant circuit 140. The reference 150 has been used to reference a duct that opens toward the exterior and which allows air encircling the coil to be evacuated in order to improve the uniformity of the magnetic field and of the radiofrequency field.

The dimensions of the various elements of the cell may vary within certain limits, while remaining compatible with most commercially available NMR probes. For example:

The gas injector 130 may have a diameter typically comprised between 50 μm and 800 μm; the same goes for any other fluid-injection ducts 131.

The ducts forming the fluidic circuit 122 may have inside diameters typically comprised between 0.5 and 3 mm.

The grid 1212 may have apertures of diameter typically comprised between 0.5 and 1 mm.

The reservoir 121 may have a volume typically comprised between 50 and 500 μL.

The lower portion T of the body of the probe may have a length that is typically of about 60 mm and a diameter typically comprised between 5 mm and 20 mm.

The measurement chamber 124 may consist of a capillary tube having an inside diameter typically comprised between 0.8 and 2 mm.

The coil 141 may have an inside diameter typically comprised between 1 and 2.5 mm (and in any case, larger than or equal to the outside diameter of the measurement chamber), and a length typically comprised between 2 and 15 mm.

The measurement chamber is preferably made of an a magnetic crystalline material, in order to achieve a good uniformity; it may advantageously be quartz. All the other elements of the cell, except the resonant circuit 140, may be made of polymer and manufactured by 3D printing, and in particular by photopolymerization. Typically, the body of the cell is manufactured in three portions: a main portion, comprising all the fluidic circuit with the exception of the capillary tube forming the measurement chamber, a cap (reference 111 in FIGS. 2B and 3B) closing the lower end of the cell and a plug (reference 112 in FIGS. 2A and 2B) in order to close the reservoir, at the upper end of the body of the cell. The assembly formed by the measurement chamber and the resonant circuit is assembled with the main portion of the body of the probe, then the cap 111 is adhesively bonded so as to seal the assembly. The plug 112, which is connected to the rod 11, is applied to close the reservoir.

As a variant, all the body of the cell, except at the very most the plug, may be manufactured as a single object, around the pre-positioned assembly formed by the measurement chamber and the resonant circuit.

Manufacturing by 3D printing has the advantage of being very simple with respect to other envisionable methods such as assembly from elements manufactured separately by molding or blowing glass. However, it also has a significant drawback: specifically, 3D-printing resins are generally incompletely polymerized and, thus, easily attacked by solvents. Furthermore, they are cytotoxic, this being unacceptable for certain applications (NMR of living cells for example). To mitigate this drawback, it is possible to deposit a protective layer on the internal surfaces of the fluidic circuit. It may in particular be a parylene layer produced by chemical vapor deposition (CVD) and typically having a thickness comprised between 500 nm and 1 μm, and for example of about 700 nm.

Figure 4A:
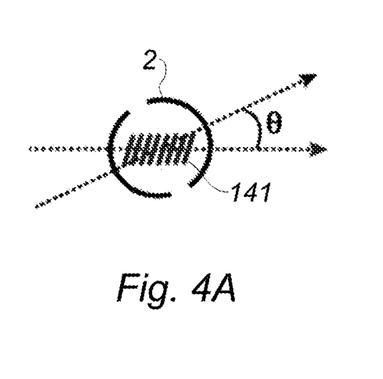
FIGS. 4A and 4B a diagram and a graph of experimental data illustrating an operation for optimizing the inductive coupling between the RF coil of the probe and the coil of the measurement cell, respectively.
Figure 4B:
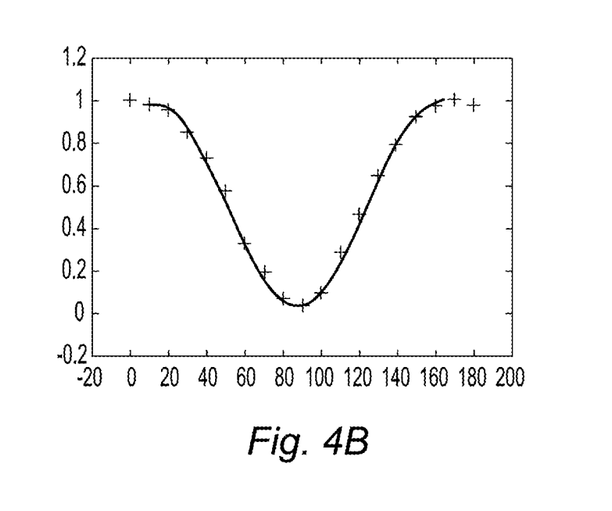
Figure 5:
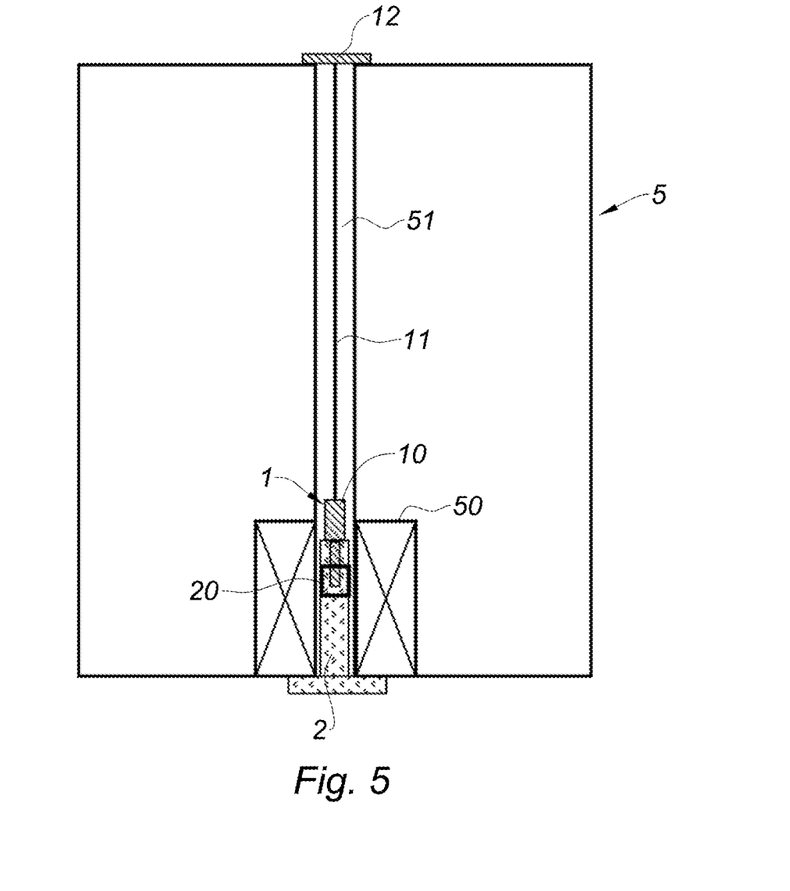
FIG. 5, a cross-sectional view of an NMR measurement system including a measurement cell according to the invention.

The use of a measurement cell according to the invention is simple. Firstly, as schematically illustrated in FIG. 5, a conventional NMR probe is installed in the magnet 50 of an NMR spectrometer 5 via the lower end of the latter. The measurement cell 1 is filled with the liquid L to be studied, then it is closed by means of the upper cap 112 which is extended by the rod 11. A flexible tube (not shown in FIG. 5) is connected on the one hand to a gas pump and on the other hand to the entrance of the injection duct 130 (other injection ducts 131 may be connected to respective pumps). The assembly thus obtained is introduced, via the upper end of the spectrometer 5, into the volume 51 located in the interior of the magnet, until the stop 12 presses against the upper surface of the spectrometer 5. At this point, the measurement chamber of the probe is located at the center of the coil 20 of the probe 2. The inductive coupling between the coils 20 and 141 depends on the orientation of the longitudinal axis of the latter with respect to the first. However, this orientation may be modified by turning the stop 12. FIG. 4A is a top view of the coil 20, of "paired saddle" type, and of the coil 141, of solenoidal type, arranged in the interior thereof. The normal to the coil 20 makes an angle θ to the longitudinal axis of the coil 141. FIG. 4B shows the dependency of the intensity of the NMR signal on the angle θ. It may be seen that the signal drops to zero for θ=90° and is of maximum value for θ=0° or 180°. The importance of maximizing the inductive coupling by adjusting the angle θ before the start of the measurement will therefore be understood.

The NMR measurement—typically a spectroscopy and/or micro-imaging measurement—is then carried out in an entirely conventional way. Consideration need merely be given to the fact that the presence of the coil 141 modifies (decreases) the resonant frequency of the probe 2. As the probe is generally tunable, to a certain extent, it is possible to compensate for this effect. As a variant, it may be exploited to detect nuclear species other than those for which the probe was designed.

The invention has been described with reference to one particular embodiment, but many variants are envisionable. For example:

The plug 112 may not be present, in which case the cell is filled via a duct 130 or 131.

The probe 2 may comprise a plurality of separate coils operating in emission and/or reception mode, all coupled to the coil—or even the coils—of the measurement cell (case of a multi-channel RF NMR apparatus); this in particular allows multi-nucleus experiments to be carried out.

The inductive coupling allows one or more radiofrequency coils to be positioned in the zone of action of the RF coil of the probe 20 in positions along a circuit of the solution, thus allowing the radiofrequency field to be locally focused and thus, at chosen positions, the sensitivity of the probe to be increased. This may be particularly useful when tracking a succession of reactions undergone by a chemical system or when tracking a process and mapping the species formed along the one or more circuits.

The electromagnetic resonator 140 may be more complex than a simple LC circuit. For example may be tunable, typically by virtue of the use of a variable capacitive element. It may also be a circuit with a plurality of resonant frequencies: in this way, one and the same measurement cell may be used to detect a plurality of distinct nuclear species.

The coil 141 may be encircled by a volume filled with a solvent the susceptibility of which corresponds to that of the liquid L that is the subject of the measurement, this allowing the uniformity of the perceived magnetic field to be increased and thus the received signal to be improved.

The rod 11/stop 12 system may be replaced by any other mechanical holding system, preferably allowing the angle of orientation θ to be adjusted or ensuring a fixed preset orientation.

Figure 6:
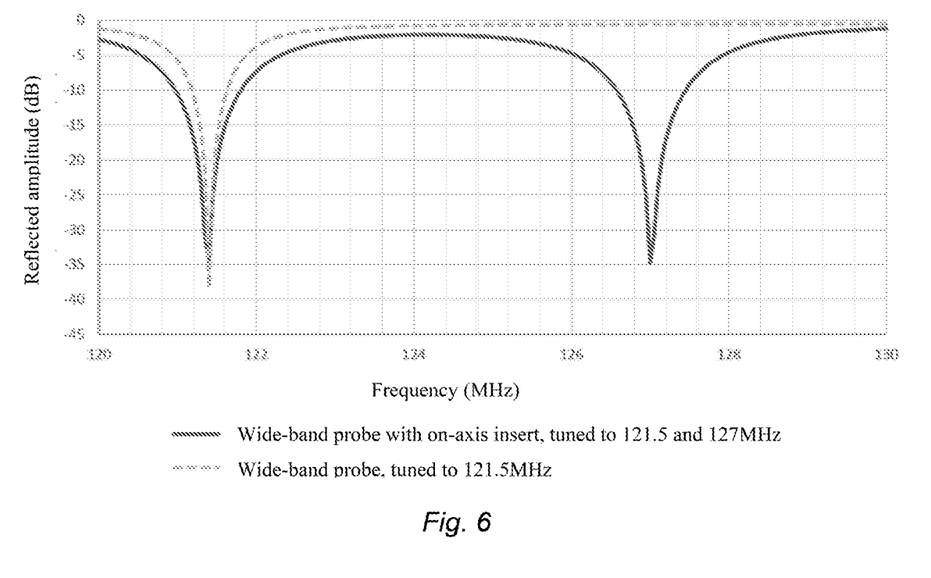
FIG. 6, the powers reflected by a prior-art probe and a probe according to the invention.

FIG. 6 shows the reflected powers measured by a network analyzer as a function of the frequency for a prior-art NMR probe not comprising any inductive system and for an NMR probe according to one embodiment of the invention. The insertion of an inductive system makes it possible to make a second resonant frequency appear. Specifically, the probe according to the invention has two resonators that are tuned to nearby frequencies and inductively coupled: resonator formed by the micro-coil and the capacitor and resonator formed by the coil and the tuning capacitors of the probe. Because of the inductive coupling, there are two resonant frequencies the spacing of which depends on the strength of the coupling, and therefore on the angle between the micro-coil and the coil of the probe. For this reason, for the probe according to the invention, a first resonant frequency is observed at 121.5 MHz and a second resonant frequency is observed at 127 MHz.

By using the graduations of the stop to determine the angle formed by the micro-coil and the coil of the probe and by suitably choosing the inductance and capacitance values of the micro-coil and the capacitor forming the resonator of the insert, it is then possible to use these two resonant frequencies to study two nuclei resonating at different frequencies while benefiting from the increase in sensitivity permitted by the fluidic circuit and the micro-coil.

The invention claimed is:

1. A liquid-state nuclear-magnetic-resonance measurement cell configured to be introduced into a nuclear magnetic resonance probe, the liquid-state nuclear-magnetic-resonance measurement cell comprising:
   a reservoir for a liquid medium;
   a fluidic circuit connected to said reservoir and comprising a measurement chamber;
   a gas injector opening into said fluidic circuit, at a distance from said measurement chamber; and
   a coil encircling said measurement chamber and comprising at least one capacitive element forming with said coil an electromagnetic resonator,
   wherein the liquid-state nuclear-magnetic-resonance measurement cell has a shape configured to replace an assembly formed by a nuclear-magnetic-resonance tube and a spinner that bears said nuclear-magnetic-resonance tube, the coil configured to couple by induction to at least one radiofrequency coil of said probe, and
   wherein the coil is positioned in a lower portion (T) of the cell configured to occupy a space in the interior of the probe provided for the nuclear-magnetic-resonance tube, and the reservoir and the gas injector are positioned in an upper portion (R) of the cell configured to occupy a space in the interior of the probe provided for the spinner, the shape and dimensions of the lower portion (T) corresponding to the shape and dimensions of the nuclear-magnetic-resonance tube and the shape and dimensions of the upper portion (R) corresponding to the shape and dimensions of the spinner.

2. The measurement cell as claimed in claim 1, wherein the fluidic circuit has a shape such that the introduction of gas by said injector causes the liquid medium to flow through the fluidic circuit.

3. The measurement cell as claimed in claim 1, wherein said fluidic circuit also comprises an orifice for exit of gas, said orifice being spaced apart from said gas injector.

4. The measurement cell as claimed in claim 1, also comprising at least one fluid injector, other than said gas injector, opening into said fluidic duct.

5. The measurement cell as claimed in claim 1, also comprising a mechanical system allowing the measurement cell to be made to turn, in the interior of said nuclear-magnetic-resonance probe, about an axis perpendicular to a longitudinal axis of said coil.

6. The measurement cell as claimed in claim 1, manufactured, with the exception at the very most of said measurement chamber and of said electromagnetic resonator, by three-dimensional printing.

7. The measurement cell as claimed in claim 6, wherein said reservoir and said fluidic circuit are produced from photopolymerized resin and have internal walls having a protective coating.

8. The measurement cell as claimed in claim 7, wherein said protective coating is made of parylene.

9. A nuclear-magnetic-resonance measurement system comprising:
   a nuclear-magnetic-resonance spectrometer;
   a nuclear-magnetic-resonance probe mounted in the interior of said nuclear-magnetic-resonance spectrometer; and
   a measurement cell as claimed in claim 1, wherein arranged in the interior of said nuclear-magnetic-resonance probe in replacement of an assembly formed by a nuclear-magnetic-resonance tube and a spinner bearing said tube.

10. The measurement system as claimed in claim 9, wherein the coil of said measurement cell is oriented so as to maximize the coupling by induction with a radiofrequency coil of said probe.

11. A magnetic-resonance measurement method comprising the steps of:
   a) filling the reservoir and fluidic circuit of a measurement cell as claimed in claim 1 with a liquid medium (L), subject of the measurement;
   b) introducing said measurement cell into a nuclear-magnetic-resonance probe mounted in a nuclear-magnetic-resonance spectrometer in replacement of an assembly formed by a nuclear-magnetic-resonance tube and a spinner bearing said tube, so that a radiofrequency coil of said probe and said coil encircling the measurement chamber are inductively coupled;
   c) introducing a gas into the gas injector of said measurement cell, causing the liquid medium to flow through the fluidic circuit of the cell;
   d) applying to a radiofrequency coil of said probe, coupled by induction to the coil of said measurement cell, a radiofrequency signal at a resonant frequency of the electromagnetic resonator of said measurement cell; and
   e) using said or another radiofrequency coil of said probe, also coupled by induction to the coil of said measurement cell, to acquire a nuclear-magnetic-resonance signal.

12. The measurement method as claimed in claim 11, also comprising a step of:
   f) turning the measurement cell about an axis perpendicular to a longitudinal axis of its coil until an intensity of said nuclear-magnetic-resonance signal is maximized.

13. The measurement method as claimed in claim 11, wherein the gas introduced into the gas injector of said measurement cell is a hyperpolarized gas.

14. The measurement method as claimed in claim 11, also comprising, after said step c), a step consisting in:
   c1) introducing into the measurement cell, by means of said gas injector or said or at least one fluid injector, at least one fluid suitable for generating a biochemical or chemical reaction with the liquid contained in the reservoir and the fluidic circuit of said measurement cell;
   the nuclear-magnetic-resonance signal acquired in said step e) allowing the progress of said biochemical or chemical reaction to be followed.

15. The measurement method as claimed in claim 11, also comprising, after said step b) and before said step d), a step consisting in:
   c1) orienting said coil encircling the measurement chamber so that the assembly formed by said radiofrequency coil, said coil encircling the measurement chamber and said capacitive element have two resonant frequencies corresponding to the resonant frequencies of two different nuclei;
   and also comprising after said step d) a step of:
   e1) using said radiofrequency coil of said probe, coupled by induction to said coil encircling the measurement chamber, to acquire a nuclear-magnetic-resonance signal of the two said nuclei.

* * * * *

UNITED STATES PATENT AND TRADEMARK OFFICE
CERTIFICATE OF CORRECTION

PATENT NO. : 11,009,573 B2  
APPLICATION NO. : 16/491136  
DATED : May 18, 2021  
INVENTOR(S) : Guillaume Carret et al.

Page 1 of 1

It is certified that error appears in the above-identified patent and that said Letters Patent is hereby corrected as shown below:

In the Claims

In Claim 14, Column 10, Line 42, "said gas injector or said or at least one fluid injector," should be -- said gas injector or at least one fluid injector, --.

Signed and Sealed this  
Fifth Day of October, 2021

Drew Hirshfeld  
*Performing the Functions and Duties of the*  
*Under Secretary of Commerce for Intellectual Property and*  
*Director of the United States Patent and Trademark Office*